United States Patent [19]
Yamamoto et al.

[11] 4,088,828
[45] May 9, 1978

[54] PRINTED CIRCUIT BOARD

[75] Inventors: Yoshio Yamamoto, Hirakata; Masaki Sono, Neyagawa; Masahiko Ekeuti, Takatsuki, all of Japan

[73] Assignee: Matsushita Electric Industrial Co., Ltd., Osaka, Japan

[21] Appl. No.: 662,440

[22] Filed: Mar. 1, 1976

[30] Foreign Application Priority Data

Mar. 4, 1975 Japan ................................. 50-26907

[51] Int. Cl.² ............................................. H05K 1/00
[52] U.S. Cl. .................................... 174/68.5; 361/397
[58] Field of Search ................. 174/68.5; 29/625, 626; 361/397, 398, 401, 403, 404

[56] References Cited
U.S. PATENT DOCUMENTS

| 3,339,008 | 8/1967 | MacArthur et al. ................ 174/68.5 |
| 3,851,223 | 11/1974 | Yonezuka et al. .............. 174/68.5 X |
| 3,887,760 | 6/1975 | Krieger et al. ....................... 174/68.5 |
| 3,969,816 | 7/1976 | Swengel, Sr. et al. ......... 174/68.5 X |

Primary Examiner—Arthur T. Grimley
Attorney, Agent, or Firm—Stevens, Davis, Miller & Mosher

[57] ABSTRACT

A printed circuit board wherein a conductor pattern is printed on an insulating base, first solder resist layers are formed on the surface of the conductor pattern remaining lands which are for soldering thereon, second solder resist layers for prevention of bridging for preventing bridging of solder are formed at least at portions where the gap between the lands is narrow, and thereby electronic parts such as an IC can be reliably assembled on the printed circuit board.

3 Claims, 4 Drawing Figures

PRINTED CIRCUIT BOARD

BACKGROUND OF THE INVENTION

This invention relates to printed circuit boards suitable for mounting electronic parts such as integrated circuit parts, having lead terminals provided at very small pitch intervals.

Generally, the surface of a printed circuit board on which surface a conductor pattern of copper or like conductor is formed is dipped through a fused solder bath or in a jet type solder bath after the electronic parts are assembled on the printed circuit board, and solder is attached to the conductive pattern surface. Thus, the leads of the electronic parts are electrically and mechanically connected to the conductor pattern. The printed circuit board is used after making these connections.

In the conductor pattern as mentioned above a layer for the resisting solder; that is the so-called solder resist layer, is formed so that solder may be attached to only fixed portions of the conductor pattern.

In the meantime, there is a trend for the gap between adjacent lands of the conducting pattern to be reduced with a tendency toward reduction in the size of electric apparatus and the use of many semiconductor integrated circuit parts, which use has been made possible with the progress of techniques concerning electronic parts; in fact it is often the case in these days that interland gaps less than the minimum gap of 0.5 millimeter prescribed in the Japanese Industrial Standard (JIS C-5010) are required.

For example, when soldering lead terminals arranged in a row such as those in a semiconductor integrated circuit component arranged at a pitch of 2.5 millimeters to the circular portion of conductor lands arranged in correspondence with the row, solder resist layers are printed with space between the layers of 0.5 millimeter or less.

DETAILED DESCRIPTION

Figure 1:
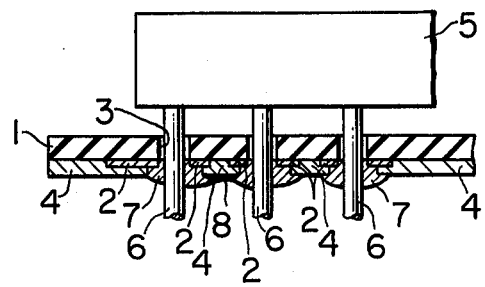
FIG. 1 is a fragmentary sectional view showing a prior art printed circuit board in the state being used.

FIG. 1 shows an example of prior art, in which the solder lead terminals of an electronic part such as a semiconductor circuit component are arranged in a row. Designated at 1 is an insulating base, at 2 conductors printed on one surface of the insulating base 1, at 3 holes for mounting lead terminals of electronic parts to be provided on the insulating base 1, at 4 solder resist layers, at 5 an electronic part such as a semiconductor integrated circuit, at 6 lead terminals of the electronic part 5, and at 7 solder portions.

In this structure, when the gap between adjacent lands of the conductor 2 becomes 0.5 mm or less, even if the solder resist layer 4 is formed, short-circuiting between the adjacent lands of the conductor or solder portions 7 on the lands occurs often due to bridging of adjacent solder portions 7 over the intervening solder resist layer 4. This is thought to occur as the result of insufficient thickness of the solder resist layer 4.

Accordingly, it has heretofore been necessary as a correction step to separate the bridging portion 8 by means such as soldering iron, but this has been an extreme disadvantage in view of productivity. Besides, when the correction is made in this way, the conductor 2 or electronic part 5 is heated twice, and this causes thermal deterioration of the conductor or electric part and hence reduction of its life; thus, this correction is one which causes great problems.

This invention solves the above drawbacks inherent in the prior art.

Figure 2:
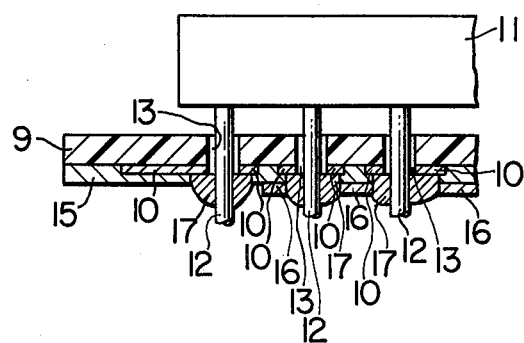
FIG. 2 is a fragmentary sectional view showing an embodiment of the printed circuit board according to the invention in the state being used.
Figure 3:
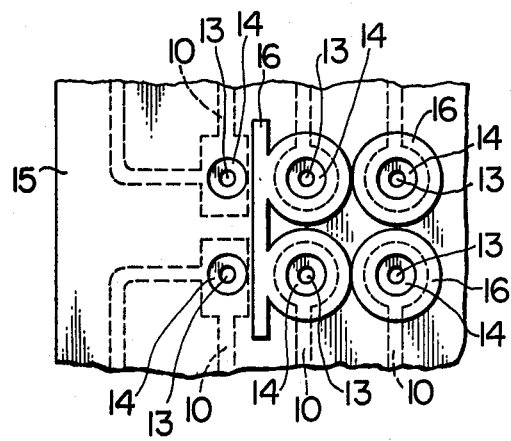
FIGS. 3 and 4 are fragmentary top views showing alternative forms of the same printed circuit board.
Figure 4:
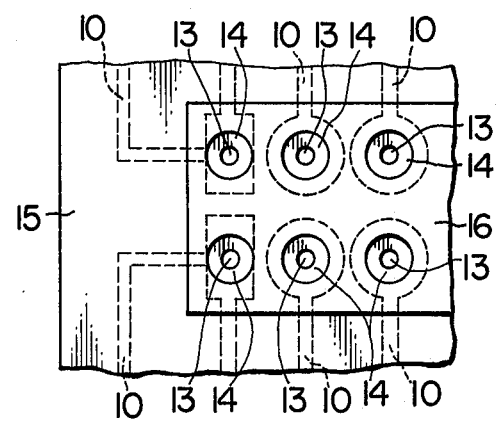

The invention will now be described in conjunction with an embodiment thereof with reference to FIGS. 2 to 4.

Designated at 9 is an insulating base consisting of a synthetic resin. A pattern of copper conductors 10 is formed by means of etching on one surface of the insulating base 9. In the insulating base 9 holes 13 are provided for receiving lead terminals 12 of an electronic part 11. Of course the conductor 10 is formed around the holes 13. A layer 15 for the resisting solder, or so-called solder resist layer, is formed on the surface of the conductor 10 remaining circular lands 14 on which soldering is possible around the respective holes 13.

Further, a solder resist layer 16 for preventing the bridging is formed where the gap between adjacent lands 14 is small, for example, 0.5 millimeter. The solder resist layer 16 for the prevention of bridging may be formed only over areas where it is actually required as shown in FIG. 3, or it may be formed over the entire area of the part where the semiconductor integrated circuit components are mounted as shown in FIG. 4.

Further, in view of the manufacturing process, in order to avoid an increase in the number of printing step, after the printing of the solder resist layer 15 which is the first layer, the solder resist layer 16 for the prevention of bridging is printed simultaneously with the printing of symbols indicating the mounted electronic parts, using an epoxy resin having the property of resisting solder as the printing ink. In this case, the positional precision is substantially the same as that in the printing of the solder resist layer 15 which is the first layer; therefore, a sufficient positional precision can be obtained, and also it is possible to print the solder resist layer having substantially the same thickness as that of the solder resist layer 15. Of course, the printing ink used must not be inferior in electric properties and moisture resistance to the first solder resist layer 15.

By providing these two solder resist layers 15 and 16, even when soldering is done, a solder 17 will never bridge the adjacent solder portions 17. Further, for the purpose of preventing bridging, one may print a plurality of bridging prevention layers instead of a single layer.

While the above embodiment is concerned with a single side or surface printed circuit board, the same effects may be obtained in the case of the double sided printed circuit board as well.

Now an example of a test will be described.

Semiconductor integrated circuit parts each having two rows of seven terminal lead pins are mounted by means of the flow soldering method. For one semiconductor integrated circuit part, all lead pins are soldered to respective lands on a printed circuit board. In this case, interland gaps are made at two rows of 6 portions, and the total of interland gaps is 12. The table below shows the results of tests for 100 semiconductor integrated circuit parts, i.e., for 1200 soldering gaps. The soldering was carried out at 260° C and with the speed of feed of the printed circuit board set to 50 cm/sec.

| Test example | Number of occurrence of solder bridge |
|---|---|
| Without solder resist layer | 587 |
| With ordinary solder resist layer | 38 |
| Example according to the invention | 2 |

As has been shown, with the printed circuit board construction according to the invention, the number of occurrence of bridging of the solder layers formed by soldering can be greatly reduced even where the interland gap is very narrow. Thus, a correction step is hardly required, and as a result thermal deterioration of the conductor pattern or electronic part is reduced and therefore, reliability of the device can be increased. Further, it permits cost reduction owing to increased productivity. Therefore, the invention is very valuable in industry.

What is claimed is:

1. A printed circuit board comprising an insulating base, a conductor pattern printed on said insulating base, a first solder resist layer formed on the entire surface of the conductor pattern remaining lands which are for soldering thereon, and a second solder resist layer for prevention of bridging of interland gaps by solder, said second solder resist layer being formed on said first solder resist layer at least over portions thereof where interland gaps are narrow.

2. A printed circuit board according to claim 1, wherein said second solder resist layer is formed over the entire area of the part for mounting electronic parts such as semiconductor integrated circuits.

3. A printed circuit board according to claim 1, wherein said second solder resist layer is printed with a mark print ink simultaneously with the printing of marks or symbols of assembled electronic parts.

* * * * *